US006974968B2

(12) United States Patent
Houston

(10) Patent No.: US 6,974,968 B2
(45) Date of Patent: Dec. 13, 2005

(54) METHOD AND APPARATUS FOR FABRICATING SELF-ALIGNED CONTACTS IN AN INTEGRATED CIRCUIT

(75) Inventor: Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/417,581

(22) Filed: Apr. 17, 2003

(65) Prior Publication Data

US 2003/0203613 A1    Oct. 30, 2003

Related U.S. Application Data

(62) Division of application No. 09/997,120, filed on Nov. 28, 2001, now Pat. No. 6,576,519.

(51) Int. Cl.⁷ .................. H01L 29/06; H01L 31/0328; H01L 29/76
(52) U.S. Cl. .................. 257/24; 257/192; 257/413
(58) Field of Search .................. 257/24, 192, 413, 257/41; 438/286, 303, 592, 595

(56) References Cited

U.S. PATENT DOCUMENTS

| | | |
|---|---|---|
| 5,306,665 A | 4/1994 | Manabe |
| 5,686,331 A | 11/1997 | Song |
| 5,981,365 A | 11/1999 | Check et al. |
| 6,096,642 A | 8/2000 | Wu |
| 6,140,219 A | 10/2000 | Dennison |
| 6,194,297 B1 | 2/2001 | Cheng |
| 6,211,048 B1 | 4/2001 | Hwang et al. |
| 6,232,183 B1 | 5/2001 | Chen et al. |
| 6,245,621 B1 | 6/2001 | Hirohama et al. |
| 6,297,136 B1 | 10/2001 | Son |
| 6,376,344 B1 | 4/2002 | Houston |
| 6,479,357 B1 | 11/2002 | Jung |

OTHER PUBLICATIONS

Stanley Wolf Silicon Processing for The VSLI Era vol. 2 Lattice Press 1990 p. 280.*
U.S. Appl. No. 09/661,735, filed Sep. 14, 2000 by Inventors Theodore W. Houston and Keith A. Joyner, entitled "Semiconductor Device with Fully Self-Aligned Local Interconnects, and Method for Fabricating the Device".

* cited by examiner

Primary Examiner—David S. Blum
(74) Attorney, Agent, or Firm—Jacqueline J. Garner; W. James Brady, III; Frederick J. Telecky, Jr.

(57) ABSTRACT

An integrated circuit includes a substrate with a gate section projecting upwardly between spaced source and drain regions. Side walls project upwardly beyond the gate section on opposite sides thereof. A dielectric layer has an upper surface spaced above the upper ends of the side walls. Contact openings are created through the dielectric layer, so as to expose surface portions on the source and drain regions. Conductive contacts are formed in the contact openings. The portions of the side walls which project above the gate section permit misalignment of the contact openings, without exposing any portion of the gate electrode during formation of either contact opening.

9 Claims, 5 Drawing Sheets

METHOD AND APPARATUS FOR FABRICATING SELF-ALIGNED CONTACTS IN AN INTEGRATED CIRCUIT

TECHNICAL FIELD OF THE INVENTION

This is a divisional application of Ser. No. 09/997,120 filed Nov. 28, 2001 now U.S. Pat No. 6,576,519.

This invention relates in general to techniques for fabricating integrated circuits and, more particularly, to a method and apparatus for fabricating self-aligned contacts in an integrated circuit.

BACKGROUND OF THE INVENTION

Over the last several decades, as the technology of fabricating integrated circuits has matured, one design criteria of progressively increasing importance has been the capability to maximize the amount of circuitry that is implemented within a given area in an integrated circuit. One common component in an integrated circuit is a field effect transistor (FET), which includes spaced source and drain regions in a substrate, a gate section disposed on the substrate at a location centered above the source and drain regions, a dielectric layer which covers the substrate and gate section, spaced contact openings which extend through the dielectric layer to the source and drain regions on opposite sides of the gate section, and electrically conductive contacts within the contact openings. The contact openings are created by etching them through the dielectric layer, at locations determined by a mask which is applied to the dielectric layer. The ability to accurately position the mask relative to the substrate is limited by certain real-world tolerances. Consequently, in a traditional approach, each of the contact openings is spaced outwardly from the gate section a sufficient distance so that, even allowing for tolerance variations in the position of the mask and thus the contact openings, neither of the contact openings will encroach on the gate section.

In order to reduce the area required for implementation of an FET transistor, designs have been developed in which the space between the contact openings is reduced until it is approximately equal to the width of the gate section. However, the same tolerances still exist with respect to placement of the mask used to create these closely-spaced contact openings. Therefore, it is fairly common that at least one of the contact openings will overlap or encroach to some extent on the gate section. These compact transistor designs and the techniques for fabricating them automatically compensate for any misalignment which may occur between the contact openings and the gate section. Therefore, the contacts in these designs are sometimes referred to as "self-aligned" contacts.

In a transistor design which uses self-aligned contacts, a focal criteria while etching the source/drain contact openings through the dielectric layer is to ensure that the etching procedure does not etch the gate section in a manner that exposes a surface of a gate electrode within the gate section. This is because, if a surface of the gate electrode is exposed by the contact opening, the conductive contact subsequently created in that contact opening will electrically engage not only the source or drain region, but also the gate electrode, thereby producing a direct short between the gate electrode and the source or drain region. At the same time, contacts to the gate must also be accomplished.

Techniques have been developed to permit fabrication of self-aligned contact openings in a manner which avoids exposing any surface of the gate electrode. These existing approaches have been generally adequate for their intended purposes, but have not been satisfactory in all respects. For example, one approach utilizes the technique of etching a single large contact opening which has respective portions disposed on opposite sides of the gate section. However, this requires one or more steps of planarizing various materials to a level corresponding to an upper end of the gate section, which in turn can place significant physical stresses on the gate section. Other techniques etch two separate contact openings, but involve an approach in which the gate is covered by the point in time where doping and/or silicide formation is to be carried out for the source and drain regions. Consequently, doping and/or silicide formation for the gate section must be separately carried out at an earlier point in time, and this in turn requires not only extra doping or gate resistance reduction steps, but also the use of one or more extra masks.

SUMMARY OF THE INVENTION

From the foregoing, it may be appreciated that a need has arisen for a method and apparatus for fabricating self-aligned contacts so as to avoid some or all of the disadvantages of pre-existing approaches. According to the present invention, a method and apparatus are provided to address this need.

More specifically, according to one form of the present invention, a method of making an integrated circuit device involves: fabricating a structure which includes a first section with an upwardly facing first surface portion thereon, and a second section which is adjacent and projects upwardly beyond the first surface portion, the second section having in the region of an upper end thereof an upwardly facing second surface portion, and the first and second surface portions each being provided on material which is one of conductive and semiconductive; forming on the second surface portion a temporary layer; forming on sides of the second section and the temporary layer nearest the first section a side wall portion which is made of a non-conductive material and which projects upwardly beyond the second surface portion; removing the temporary layer; forming a dielectric layer with a top surface spaced substantially above the upper end of the side wall portion; etching the dielectric layer according to a pattern to create a recess portion which extends downwardly within the dielectric layer, the etching step being carried out with a selective etching technique that favors etching of the dielectric material over etching of the material of the side wall portion, wherein at the completion of the etching step a region of the first surface portion is exposed; and filling the recess portion with a conductive material which engages the region of the first surface portion and has on an upper end thereof an upwardly facing surface portion.

According to another form of the present invention, an integrated circuit apparatus includes: structure which includes a first section with an upwardly facing first surface portion thereon, and a second section which is adjacent and projects upwardly beyond the first surface portion, the second section having in the region of an upper end thereof an upwardly facing second surface portion, and the first and second surface portions each being provided on material which is one of conductive and semiconductive; a side wall portion which is disposed on a side of the second section nearest the first section, which is made of a non-conductive material, and which projects upwardly beyond the second surface portion; a non-conductive layer extending over the first and second sections, the non-conductive layer having a top surface spaced substantially above the upper end of the side wall portion, having a further surface on an underside thereof which conforms to the side wall portion and the first and second surface portions, and having therein a recess portion which extends downwardly within the non-conductive layer to a region of the first surface portion; and a portion of conductive material disposed in the recess portion in engagement with the region of the first surface portion, and with an upwardly facing surface portion on an upper end thereof.

According to still another form of the present invention, an integrated circuit apparatus includes: structure having a first section with an upwardly facing first surface portion thereon, and a second section which is adjacent and projects upwardly beyond the first surface portion, the second section having in the region of an upper end thereof an upwardly facing second surface portion, the first and second surface portions each being provided on material which is one of conductive and semiconductive, and the second surface portion having a silicide formed thereon; a side wall portion which is disposed on a side of the second section nearest the first section, which is made of a non-conductive material, and which projects upwardly beyond the second surface portion; a dielectric layer having a top surface spaced substantially above the upper end of the side wall portion, and having therein a recess portion which extends downwardly within the dielectric layer to a region of the first surface portion; and a portion of conductive material disposed in the recess portion in engagement with the region of the first surface portion, and with an upwardly facing surface portion on an upper end thereof.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
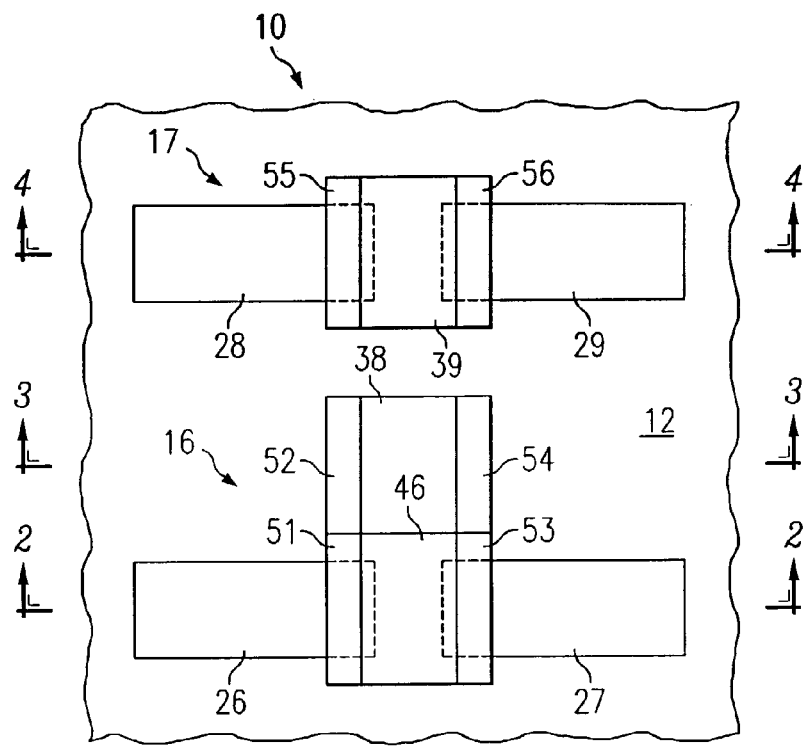
FIG. 1 is a diagrammatic fragmentary top view of an integrated circuit which embodies aspects of the present invention, showing its configuration at an intermediate stage during fabrication according to a method that embodies aspects of the present invention.

FIG. 1 is a diagrammatic fragmentary top view of part of an integrated circuit 10 which embodies aspects of the present invention. FIG. 1 shows the configuration of the integrated circuit at an intermediate stage during its fabrication according to a method which embodies aspects of the present invention. The following discussion of the structure of the integrated circuit 10 also includes some explanatory comments about the method by which the integrated circuit 10 is fabricated.

The integrated circuit 10 includes a semiconductor substrate 12 made of a p-type silicon material. The integrated circuit 10 also includes two field effect transistors (FETs) 16 and 17, which are depicted in a state of partial fabrication in FIG. 1. Transistor 16 is configured with self-aligned contacts that embody aspects of the present invention. Transistor 17 has standard contacts which are not self-aligned, and which are therefore not illustrated and described in detail herein. Transistor 17 is included in several figures in order to show how the transistor 16 which embodies aspects of the present invention can be fabricated at the same time as a standard transistor such as that shown at 17.

Figure 2:
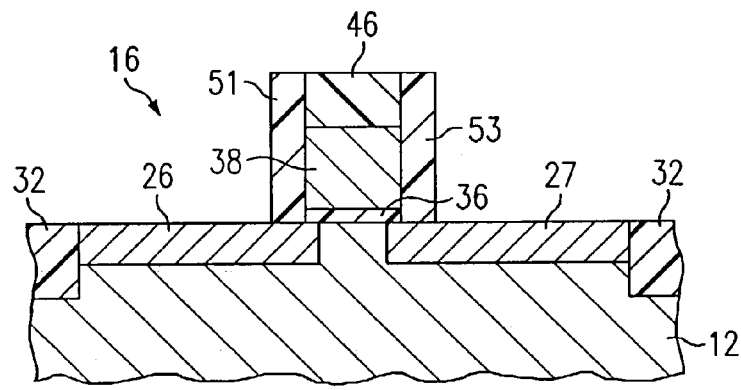
FIG. 2 is a diagrammatic fragmentary sectional side view taken along the section line 2—2 in FIG. 1.
Figure 3:
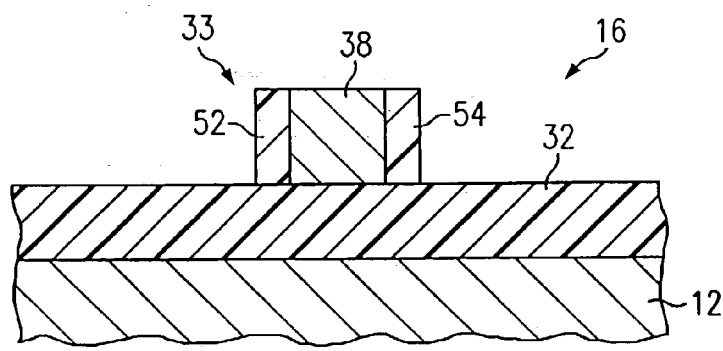
FIG. 3 is a diagrammatic fragmentary sectional side view taken along the section line 3—3 in FIG. 1.
Figure 4:
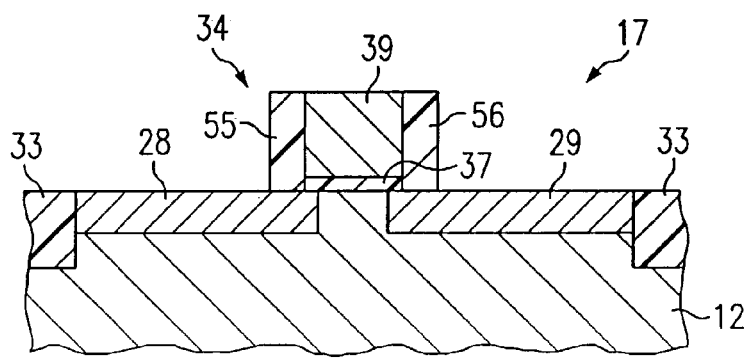
FIG. 4 is a diagrammatic fragmentary sectional side view taken along the section line 4—4 in FIG. 1.

FIG. 2 is a diagrammatic fragmentary sectional side view of the partially fabricated transistor 16, taken along the section line 2—2 in FIG. 1. FIG. 3 is a diagrammatic fragmentary sectional side view of a different part of the partially fabricated transistor 16, taken along the section line 3—3 in FIG. 1. FIG. 4 is a diagrammatic fragmentary sectional side view of the partially fabricated transistor 17, taken along the section line 4—4 in FIG. 1.

Referring to FIGS. 1, 2 and 4, a pair of spaced source and drain regions 26 and 27 are formed in the substrate 12. At a location spaced from the source and drain regions 26 and 27, a further pair of spaced source and drain regions 28 and 29 are also formed in the substrate 12. The source and drain regions 26–27 are part of the transistor 16, and the source and drain regions 28 and 29 are part of the transistor 17. The source and drain region 26–29 are each an n+ region, and each have a top surface which is part of the top surface of the substrate 12. The substrate 12 has shallow trench isolation (STI) regions 32 and 33 extending around the source and drain regions.

The transistor 16 includes a gate oxide layer 36, which is provided on the upper surface of the substrate 12 at a location centered above the source and drain regions 26 and 27. The oxide layer 36 slightly overlaps each of the source and drain regions 26–27. Similarly, the transistor 17 includes a gate oxide layer 37, which is provided on the upper surface of the substrate 12 at a location centered between the source and drain regions 28 and 29. The oxide layer 37 slightly overlaps each of the source and drain regions 28 and 29. In the integrated circuit 10, the gate oxide layers 36–37 are each made of silicon dioxide, but could alternatively be made of some other suitable material. A gate electrode 38 is provided on top of the gate oxide layer 36, and a gate electrode 39 is provided on top of the oxide layer 37. The gate electrodes 38 and 39 are each an n+ doped polysilicon material, but could alternatively be made of some other suitable material. As evident from FIG. 3, the gate oxide layer 36 is not present under the end portion of the gate electrode 38 which is remote from the source and drain regions 26 and 27, because this portion of the substrate includes the STI isolation region 32, and the gate oxide layer is not grown on this portion of the substrate.

The oxide layer 36 and electrode 38 together form a gate section of the transistor 16, and the oxide layer 37 and gate electrode 39 together form a gate section of the transistor 17. During fabrication of the integrated circuit 10, a temporary portion or cap 46 of paralyne is formed-on top of part of the gate electrode 38, for a purpose discussed below. In the disclosed embodiment, the procedure used to fabricate this multi-layer structure involves growing a layer of silicon dioxide on selected portions of the upper surface of the substrate 12, then forming a layer of polysilicon material on top of the silicon dioxide layer, then forming a layer of paralyne on top of the polysilicon layer, and then subjecting all three layers to a patterned etch using known techniques. The etch procedure results in the gate section which includes the oxide layer 36 and gate electrode 38, and also the gate section which includes the oxide layer 37 and gate electrode 39. At this point in the process, each gate section still has on top of it a portion of the paralyne layer.

Although the foregoing discussion explains that the gate oxide layer 36, gate electrode 38 and paralyne cap 46 are all etched at the same time by a single etch step, it would alternatively be possible to use more than one etch step. For example, cap 46 and gate electrode 38 could be formed by one etch step, and the gate oxide layer 36 could be etched later. In addition, although the disclosed embodiment uses paralyne, it would alternatively be possible to use some other suitable etch selectable material, such as silicon carbide.

A further patterned etch is then carried out on these portions of the paralyne layer, in order to remove the portion of the paralyne on the gate electrode 39, and half of the paralyne on the gate electrode 38, so that the only remaining paralyne is the portion 46 disposed on about half of the gate electrode 38. In some embodiments, discussed later, it is not necessary to carry out a further patterned etch to remove portions of the paralyne layer. As another alternative, in order to remove the paralyne where no self-aligned contact is needed, the paralyne can be patterned and etched before the pattern and etch of the gate pattern.

At this point in the process, a medium doping with a shallow depth may be carried out in the source and drain regions 26–29. Portions of the gate electrodes 38 and 39 which do not have the paralyne cover 46 thereon will receive this doping as well, although this medium doping is effective primarily with respect to the functioning of the source and drain regions and not the gate electrodes.

Next, side walls 51–56 are formed on opposite sides of each of the two gate sections. With reference to FIGS. 1–3, the side walls 51 and 53 are respective portions of a single side wall, but have different heights as a result of the fact that the paralyne cover 46 is present on only about half of the gate electrode 38, such that the side walls which form on this half are thus taller than the side walls which form on the other half. That is, the side wall 51 is taller than the side wall 52, even though they are respective parts of a single side wall. In a similar manner, the side walls 53 and 54 are respective parts of a single side wall, the side wall 53 being taller than the side wall 54. The side walls 51–56 are made of silicon nitride ($Si_3N_4$), but could alternatively be made of some other suitable material, or a composite of materials, which would include a configuration in which the side walls had multiple layers made of respective different materials. The side walls 51–56 are formed using techniques which are known in the art, and which are therefore not described in detail here.

As noted above, the gate oxide layer 36 and the gate electrode 38 are formed at the same time by the same etch step, but it would alternatively be possible to form the gate electrode with one etch step and then etch the gate oxide layer at a later time with a different etch step. In this regard, the etch step for the gate oxide layer 36 could be carried out after the side walls 51 and 53 have been formed, and in that case the gate oxide layer 36 would have edge portions disposed between the substrate 12 and the lower ends of the side walls 51 and 53. The same is true for the gate oxide layer 37 of the transistor 17.

Figure 5:
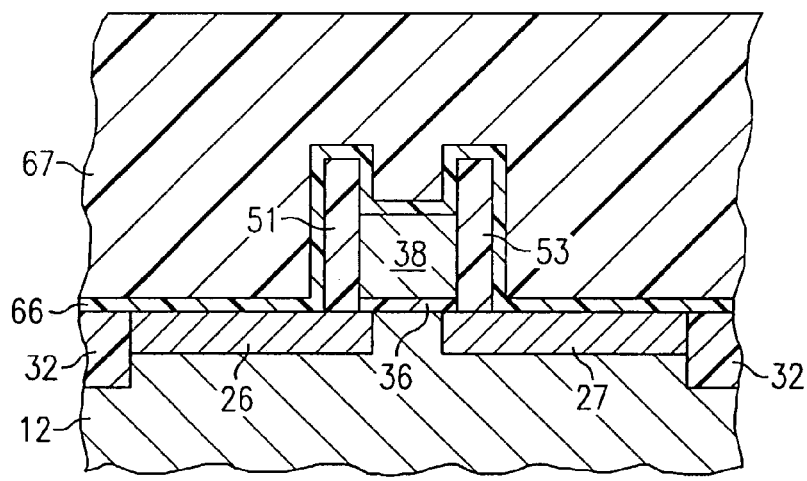
FIG. 5 is a diagrammatic fragmentary sectional side view similar to FIG. 2, but showing the integrated circuit of FIG. 2 at a later stage during its fabrication.
Figure 6:
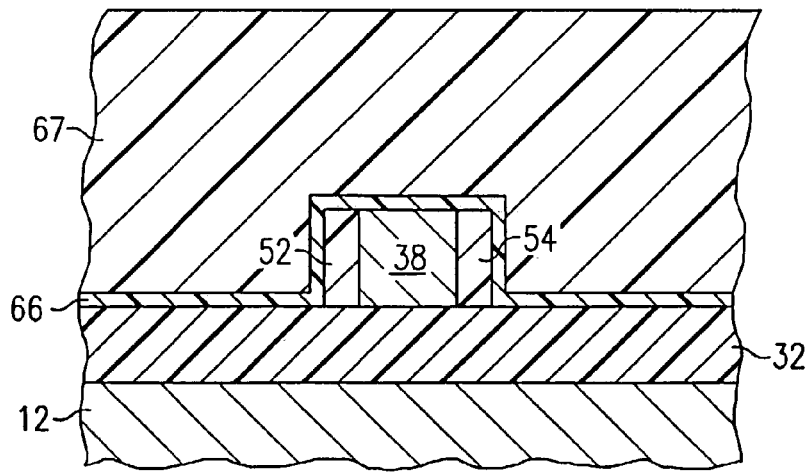
FIG. 6 is a diagrammatic fragmentary sectional side view similar to FIG. 3, but showing the integrated circuit of FIG. 3 at a later stage during its fabrication, which is a stage that corresponds to the stage of FIG. 5.

Next, the paralyne cover 46 is removed using a selective etch of a known type. In this regard, FIG. 5 is a diagrammatic fragmentary sectional side view corresponding to FIG. 2, but showing the same portion of the integrated circuit 10 at a later stage during its fabrication. FIG. 6 is a diagrammatic fragmentary sectional side view similar to FIG. 3, but showing the integrated circuit 10 at a later stage during its fabrication. FIG. 5 reflects the removal of the paralyne cover shown at 46 in FIG. 2. It will also be noted that the side walls 51 and 53 each project upwardly beyond the top surface of the gate electrode 38.

At this point, certain standard steps can be carried out in the usual manner. These steps include doping of the source and drain regions 26–29 and/or the gate electrodes 38 and 39, and/or silicide formation on the exposed surfaces of the source and drain regions 26–29 and/or the gate electrodes 38 and 39. Since persons skilled in the art are thoroughly familiar with these steps, they are not illustrated and described in detail here.

Next, a relatively thin layer 66 referred to as a liner is formed over the developing structure of the integrated circuit. In this embodiment, the liner 66 is made of silicon nitride ($Si_3N_4$), but it could alternatively be made of some other suitable material. Next, a layer 67 of a dielectric material is formed over the liner 66. In this embodiment, the dielectric layer 66 is made from silicon dioxide, but some other suitable dielectric material could alternatively be used. The dielectric layer 66 is sufficiently thick so that the top surface thereof is spaced upwardly from the upper ends of the tallest side walls 51 and 53.

Figure 7:
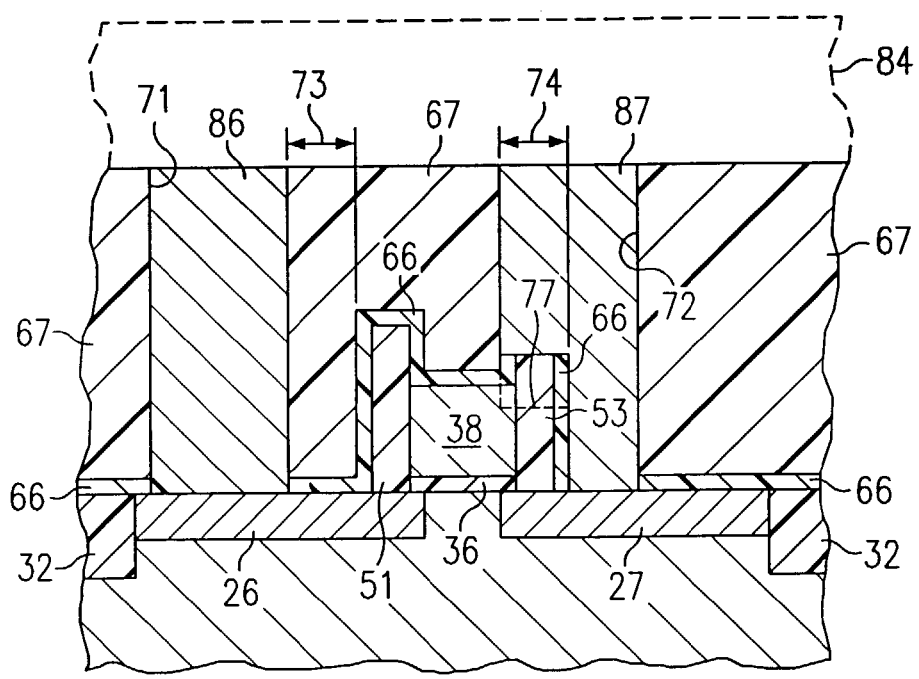
FIG. 7 is a diagrammatic fragmentary sectional side view similar to FIG. 5, but showing the integrated circuit of FIG. 5 at a later stage during its fabrication.

Next, with reference to FIG. 7, a patterned etch of the dielectric layer 67 and liner 66 is carried out, in order to form self-aligned recesses 71 and 72, which can also be referred to as contact openings. The openings 71 and 72 each extend vertically through the dielectric layer 67 and liner 66, to an upper surface of a respective one of the source and drain regions 26 and 27. In order to minimize the area of the integrated circuit which is used to implement the transistor of FIG. 7, the contact openings 71 and 72 each are positioned so as to be relatively close to the gate structure which projects upwardly from the substrate 12, including the oxide layer 36, the gate electrode 38, the side walls 51 and 53, and the portion of the liner 66 on the side walls 51 and 53. In the disclosed embodiment, the spacing between each contact opening and the gate structure is such that the contact openings 71 and 72 are spaced from each other by a distance which is approximately equal to the width of the gate structure. Although the contact openings 71 and 72 have this spacing with respect to the gate structure in the disclosed embodiment, it would alternatively be possible for the spacing to be larger or smaller. If the openings 71 and 72 were not part of a self-aligned contact configuration, there would be a still larger space between each contact opening and the gate structure.

Ideally, the mask for the etch that creates openings 71–72 should be positioned relative to the substrate 12 such that this upwardly projecting structure is accurately centered between the openings 71 and 72. In practice, however, actual tolerances make it difficult to achieve precise alignment. Consequently, FIG. 7 shows a situation in which the openings 71 and 72 are each offset leftwardly from their ideal positions by respective distances 73 and 74 that are equal.

The distance 74 represents the maximum amount of offset or misalignment that can be tolerated while ensuring that neither of the openings 71 and 72 exposes any surface of the gate electrode 38. In this regard, it will be noted that the misalignment 74 has caused the selective etch process to etch away a portion of the upper end of the side wall 53, and a portion of the liner 66 thereon. This is because the materials of the side wall 53 and the liner 66 can be etched away by the etch process used to create the openings 71 and 72, although at a rate which is much slower than the rate at which the material of the dielectric layer 67 is etched away by this etch process, and because the final step of the contact etch is to etch the liner 66.

It will be recognized that, if the side walls 51 and 53 did not project upwardly beyond the upper surface of the gate electrode 38, then during creation of the opening 72 the misalignment 74 would have resulted in etching of the side wall 53, the gate electrode 38 and the liner 66, to an extent indicated diagrammatically by broken line 77 in FIG. 7. In that event, and as evident from FIG. 7, the opening 72 would have exposed a portion of the gate electrode 38. This in turn would have eventually led to an electrical short between the gate electrode 38 and the drain region 27, in particular after the opening 72 had in due course been filled with a conductive metal, in a manner described later. Thus, due to the portions of the side walls 51 and 53 which project above the gate electrode 38, and due to the portions of the liner 66 thereon, the openings 71 and 72 could be offset in either direction from an ideal position by an amount equal to the dimension indicated at 73 and at 74, without causing either of the openings 71 and 72 to expose any portion of the gate electrode 38. This is why these openings and the contacts eventually formed in them are referred to as self-aligning contacts.

Of course, some minimal thickness of dielectric material is needed between the contact and the gate to avoid dielectric breakdown when voltages are applied. Consequently, in a known configuration with contacts that are not self-aligned, breakdown will occur even before misalignment causes actual overlap of the contact to the gate, where the amount of dielectric material between the contact and gate is too small to prevent dielectric breakdown. In contrast, use of the present invention provides an increase to the alignment tolerance which is greater than just the thickness of the liner 66. In particular, the extended height of the side wall helps to keep the overlapping portion of the contact spaced vertically higher than the gate, so that vertical spacing between the contact and gate becomes the critical factor, rather than the horizontal spacing therebetween. As a result, it will be recognized that some benefit is provided by the extended height of the side wall, even without the liner 66.

Figure 8:
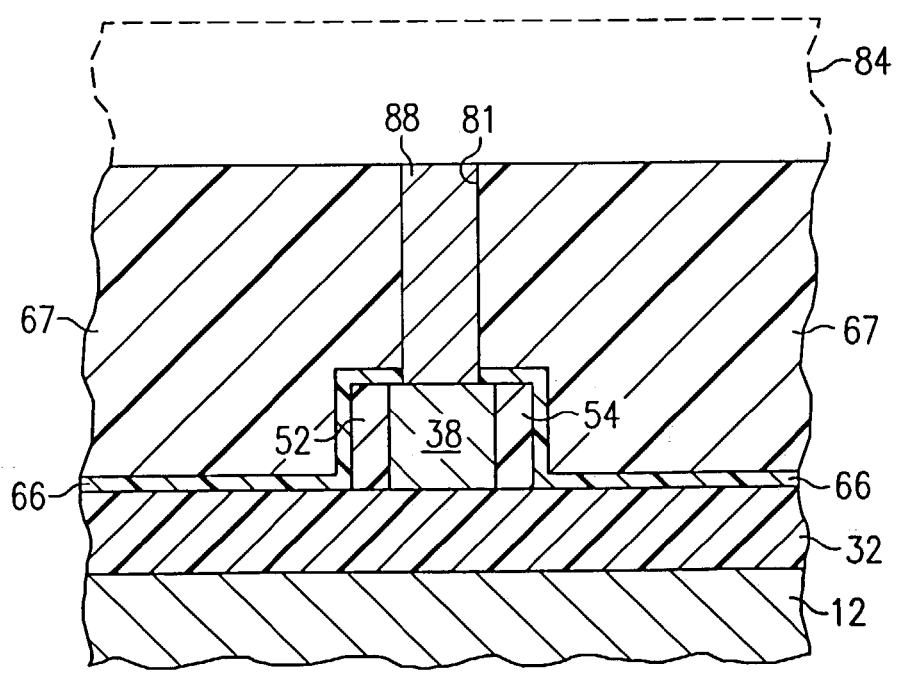
FIG. 8 is a diagrammatic fragmentary sectional side view similar to FIG. 6, but showing the integrated circuit of FIG. 6 at a later stage during its fabrication, which is a stage that corresponds to the stage shown in FIG. 7.

Next, with reference to FIG. 8, a further patterned etch is carried out in order to create a recess or opening 81 through the dielectric layer 67 and liner 66, so as to expose a portion of the top surface of the gate electrode 38. For purposes of the present discussion, it is assumed that the mask for this etch procedure happens to be relatively accurately aligned with the substrate 12, such that the opening 81 is relatively well centered above the gate electrode 38.

For purposes of convenience and clarity, the present discussion explains that the opening 81 is created by a patterned etch different from the patterned etch used to create the openings 71–72. However, persons skilled in the art will recognize that it would alternatively be possible to create the opening 81 with the same patterned etch which is used to create the openings 71–72, although in that case the opening 81 would exhibit the same amount of offset that the openings 71–72 exhibit at 73–74.

Contact openings for the source or drain of transistor 17 (FIG. 1) can also be created by a suitable patterned etch, which may be the same etch procedure used to create the openings 71 and 72, or a different etch procedure. The contacts to the source and drain of transistor 17, which are not self-aligned, need to be spaced further from the gate 39 then the self-aligned contacts 71 and 72 are spaced from the gate 38. Persons skilled in the art will recognize how openings for the transistor 17 are created, and the creation of these openings is therefore not described here in detail.

After creation of all appropriate openings through the dielectric layer 67 and liner 66, including the openings 71–72 and 81, a layer 84 of a conductive material is deposited over the top of the partially fabricated structure, in a manner such that each of the openings 71–72 and 81 is filled with the conductive material. In the disclosed embodiment, the conductive layer 84 is made from tungsten, but it could alternatively be some other suitable conductive material, or composite of conductive materials. Then, planarization is carried out in a known manner, for example through use of a chemical mechanical polishing (CMP) technique, in order to remove the portion of the tungsten layer 84 which is disposed above the top surface of the dielectric layer 67. After the planarization, the openings 71–72 and 81 contain respective portions 86–88 of the tungsten material, which are referred to as "contacts". The contacts 86–88 each have at the upper end thereof an upwardly facing surface, which is substantially coplanar with the top surface of the dielectric layer 67.

Figure 9:
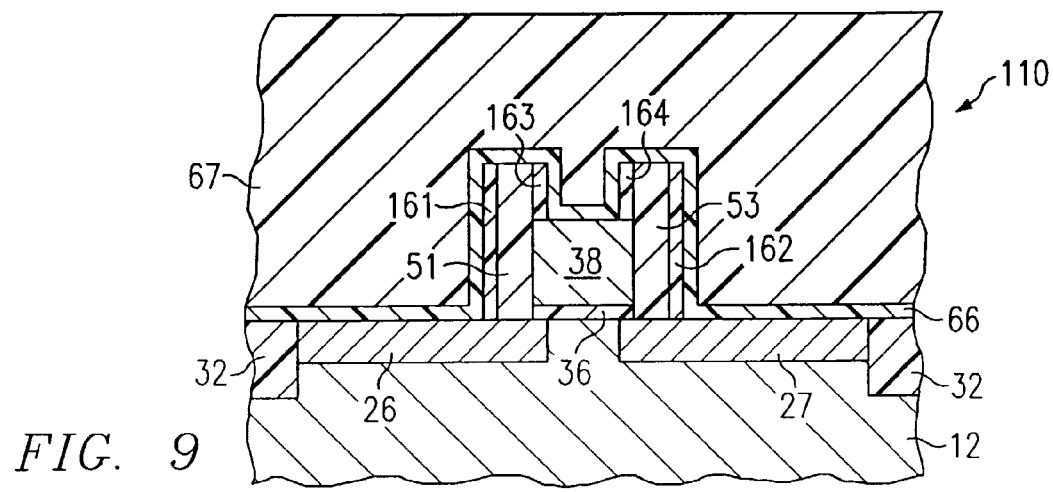
FIG. 9 is a diagrammatic fragmentary sectional side view similar to FIG. 5, but showing an integrated circuit which is alternative embodiment of the integrated circuit shown in FIG. 5, at an intermediate stage during its fabrication.

FIG. 9 is a diagrammatic fragmentary sectional side view similar to FIG. 5, but showing an integrated circuit 110 which is an alternative embodiment of the integrated circuit shown in FIG. 5. The integrated circuit 110 of FIG. 9 is shown at a stage of fabrication which is equivalent to the stage of fabrication of the integrated circuit shown in FIG. 5. Components in FIG. 9 which are equivalent to components in FIG. 5 are identified with the same reference numerals, and the following discussion is directed primarily to differences.

More specifically, the integrated circuit 110 includes a substrate 12 with spaced source and drain regions 26 and 27, and with a gate section that includes oxide layer 36 and gate electrode 38. Through use of a not-illustrated temporary cover similar the cover shown at 46 in FIG. 2, side walls 51 and 53 are formed on opposite sides of the gate section, and have upper ends which project upwardly beyond the top of the gate electrode 38.

After the side walls 51 and 53 have been formed, supplemental side walls 161–164 are formed. In particular, the side walls 161 and 162 are respectively formed on the outer sides of the side walls 51 and 53, and the side walls 163 and 164 are respectively formed on the inner sides of the upper ends of the side walls 51 and 53. The side walls 161 and 162 extend from the top of the substrate 12 upwardly to the upper ends of the side walls 51 and 53. Side walls 163 and 164 each extend from the top surface of the gate electrode 38 up to the upper ends of the side walls 51 and 53. The supplemental side walls 161–164 are made from silicon nitride ($Si_3N_4$), but could alternatively be made from some other suitable material.

One technique for forming the side walls 161–164 is to deposit a layer of silicon nitride over the top of the partially fabricated integrated circuit, and then carry out an isotropic etch of this layer to remove portions other than those which become the supplemental side walls 161–164. It will be noted that the side walls 161 and 163 effectively widen the upper end of the side wall 51, and that the side walls 162 and 164 effectively widen the upper end of the side wall 53. The supplemental side walls can be formed before or after the gate is subject to implants (doping) and silicide formation. The supplemental side walls can be part of a standard process sequence to use multiple side walls to space different implants from the gate region.

After the supplemental side walls 161–164 have been formed, the liner 66 and dielectric layer 67 are deposited over the partially fabricated structure of the integrated circuit, as shown in FIG. 9.

Figure 10:
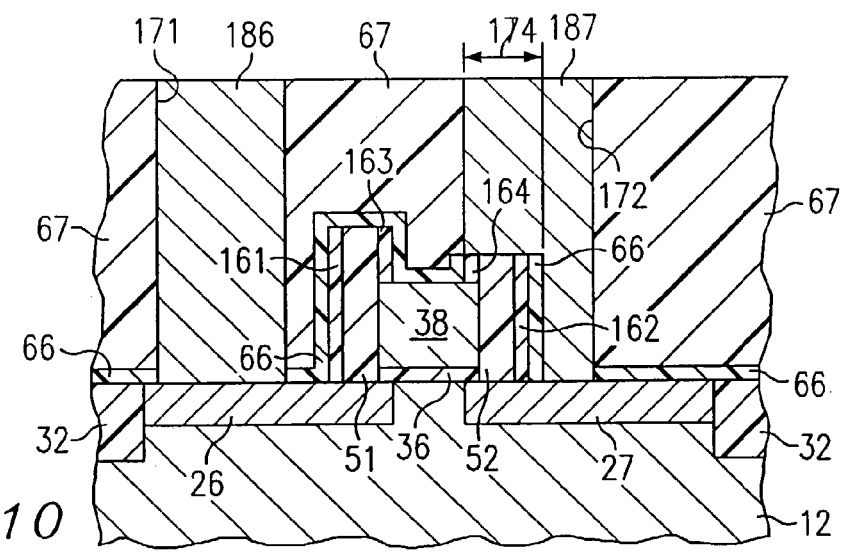
FIG. 10 is a diagrammatic fragmentary sectional side view similar to FIG. 9, but showing the integrated circuit of FIG. 9 at a later stage during its fabrication.

FIG. 10 is a diagrammatic fragmentary sectional side view similar to FIG. 9, but showing the integrated circuit of FIG. 9 at a later stage during its fabrication. In this regard, it will be noted from FIG. 10 that recesses or contact openings 171 and 172 have been etched through the dielectric layer 67 and liner 66, in a manner similar to that described above for the openings 71 and 72 in FIG. 7. It will also be noted that the maximum allowable offset or misalignment s which can be tolerated without exposing part of the gate electrode is indicated by reference numeral 174, and is larger than the maximum allowable misalignment 74 in FIG. 7. This is due to the fact that the supplemental side walls, especially the supplemental side walls 161 and 164, increase the effective thickness of the upper ends of the side walls 51 and 52. In due course, tungsten contacts 186 and 187 are formed in the openings 171 and 172, in a manner similar to that described above for the contacts 86 and 87 of FIG. 7.

In view of the foregoing discussion of the supplemental side walls 163 and 164, it will be recognized that, in each of the embodiments of FIGS. 1–8 and 9–10, portions of the liner 66 effectively function in the same manner as the side walls 163 and 164 for purposes of extending the self-alignment protection over the gate. Consequently, these portions of the liner 66 can be viewed as supplemental side walls.

Figure 11:
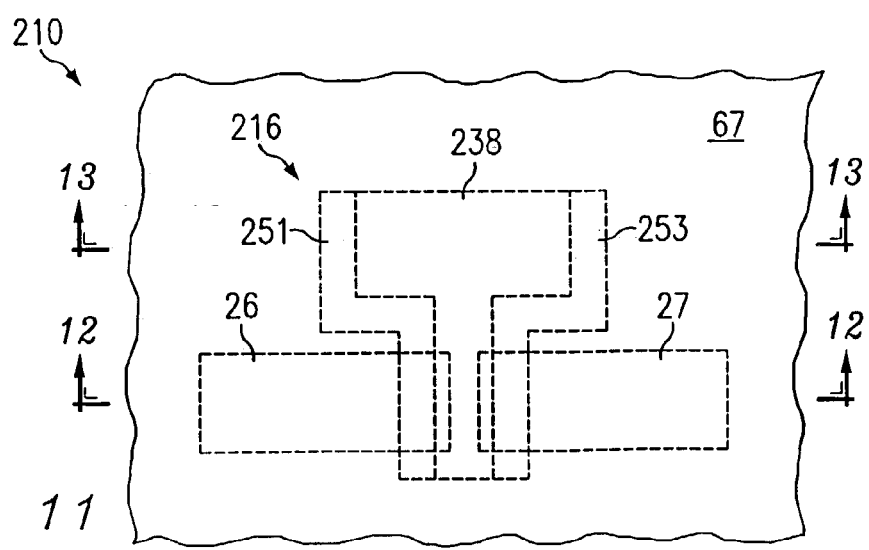
FIG. 11 is a diagrammatic fragmentary top view of an integrated circuit which is another alternative embodiment of the integrated circuit of FIG. 1.
Figure 12:
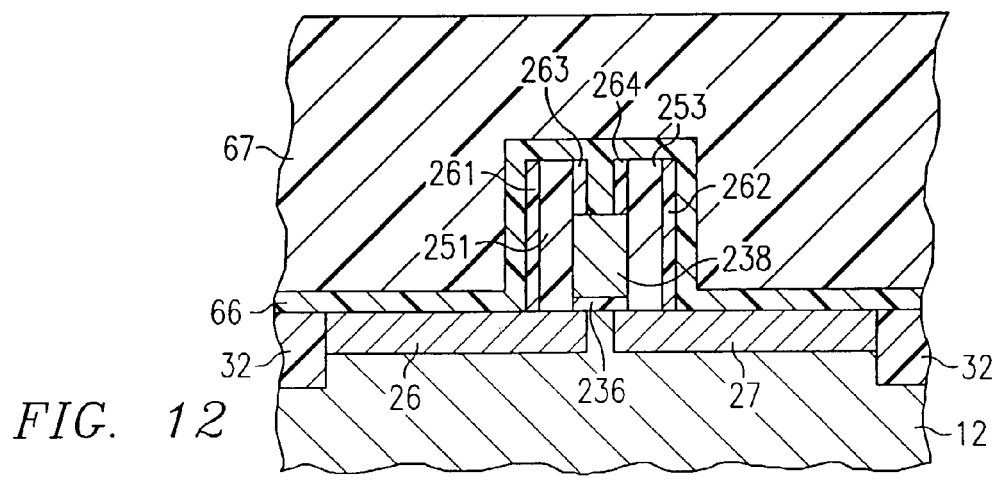
FIG. 12 is a diagrammatic fragmentary sectional side view taken along the section line 12—12 in FIG. 11.
Figure 13:
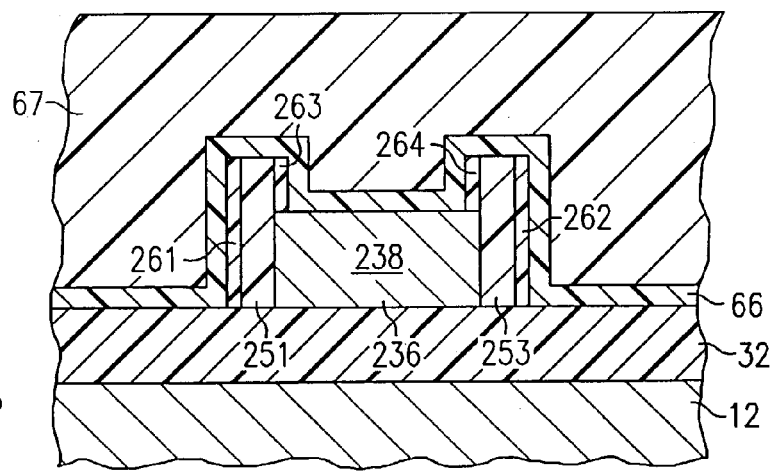
FIG. 13 is a diagrammatic fragmentary sectional side view taken along the section line 13—13 in FIG. 11.

FIG. 11 is a diagrammatic fragmentary top view of a partially fabricated integrated circuit 210, which is an alternative embodiment of the integrated circuit 10 of FIGS. 1–8. The integrated circuit 210 includes an FET 216, certain portions of which are indicated by broken lines in FIG. 11. FIG. 12 is a diagrammatic fragmentary sectional side view of the partially fabricated integrated circuit 210, taken along the section line 12—12 in FIG. 11. FIG. 13 is a diagrammatic fragmentary sectional side view of a different portion of the partially fabricated integrated circuit 210, taken along the section line 13—13 in FIG. 11. Components in FIG. 12 which are equivalent to components discussed previously are identified with the same reference numerals. The following discussion focuses on the differences between this embodiment and other embodiments.

In FIG. 12, the integrated circuit 210 includes a semiconductor substrate 12 with spaced source and drain regions 26 and 27. A gate section is provided on the substrate 12, and includes a gate oxide layer 236 with a gate electrode 238 thereon. This gate section is similar to the previously-discussed gate sections except that, as best seen in FIG. 11, the portion thereof which is centered above the source and drain regions 26–27 has a width smaller than the width of an opposite end thereof. FIG. 11 shows this T-shape or "step" shape of the gate electrode 238. The oxide layer 236 is present below the electrode layer 238 only in the region of the wider portion of the gate electrode, and not the narrower portion of the gate electrode, because the substrate has the STI region 32 below the narrower portion of the gate electrode 238. Through use of a not-illustrated temporary paralyne cover similar to that shown at 46 in FIG. 2, side walls 251 and 253 are formed on opposite sides of the gate section defined by the oxide layer 236 and gate electrode 238, and these side walls each project upwardly past the top of the gate electrode 238 along the entire length thereof. It will thus be recognized that the not-illustrated temporary paralyne cap used to form these side walls covered the entire gate electrode 238. This means that, following the etch which formed the oxide layer 236, the gate electrode 238 and the paralyne cap on the gate electrode, it was not necessary to carry out a further etch of just the paralyne layer, which is an advantage.

After formation of the side walls 251 and 253, supplemental side walls 261–264 are formed thereon, in a manner similar to that discussed above in association with formation of the supplemental side walls 161–164 in FIG. 9. Then, the liner 66 and dielectric layer 67 are formed. The liner 66 of FIG. 12 has a slightly greater thickness than the liners in the other embodiments discussed above. It will be noted from FIG. 12 that, in the region of the narrower portion of the gaze electrode 238, the distance between the supplemental side walls 263–264 is slightly less than twice the thickness of the liner 66. As a result, the material of the liner 66 completely fills the space between the side walls 263 and 264 in the region above the narrower portion of the gate electrode 238.

Although the liner 66 is shown in FIG. 11 as having a slightly greater thickness than in the other embodiments described earlier, it can be advantageous for the liner 66 of FIG. 11 to have a standard thickness, which avoids changing the standard process flow used to create the liner. This can be achieved under appropriate circumstances, for example where the gate has a relatively small width and/or supplemental side walls are used, and where the standard liner thickness is suitable in relation the gate width and the thickness of the supplemental side walls.

With reference to FIG. 13, which shows the wider portion of the gate electrode 238, the distance between the supplemental side walls 263–264 in the region of this portion of the gate electrode is somewhat greater than twice the thickness of the liner 66. Thus, the region between the supplemental side walls 263–264 in this wider portion of the gate electrode 238 is not completely filled by the material of the liner 66. Next, contact openings are formed through the dielectric layer 67 and liner 66, in a manner similar to that described above for prior embodiments.

It will be noted from FIG. 12 that, at the narrow end of the gate electrode 238, the gate electrode 238 is completely protected from any problem due to misalignment of the type discussed above, due to the fact that the material of the liner 66 completely fills the space between the side walls 263 and 264. Consequently, when etching self-aligned contact openings (not illustrated) for the embodiment of FIG. 12, no amount of misalignment will cause any portion of the gate electrode 238 to be exposed within either contact opening as result of the etching procedure. Consequently, virtually any amount of misalignment is tolerable, so long as each contact opening exposes a sufficiently large portion of the upper surface of the source region 26 or drain region 27.

As evident from FIG. 13, the material of the liner 66 does not fill the entire region between the side walls 263 and 264 at the wider end of the gate electrode 238. Consequently, a portion of the liner 66 extending between the supplemental side walls 263 and 264 is sufficiently thin so that a contact opening can be etched through it for purposes of facilitating electrical coupling of the gate electrode 238 to some other circuit component. Because it is possible for a contact to be electrically coupled to the gate in this manner, even where the extended side walls are present, it is possible to create contact to gate areas without any need for an extra mask step, such as a mask step to pattern and etch a temporary paralyne layer of the type discussed earlier. This represents a savings over pre-existing techniques for making self-aligned contacts. It is possible to make contact to the gate in regions where the side walls extend upwardly beyond the gate surface if the gate is wider than twice the liner thickness. Depending on the gate width and liner thickness, this may not require a widening of the gate for the gate contact.

Figure 14:
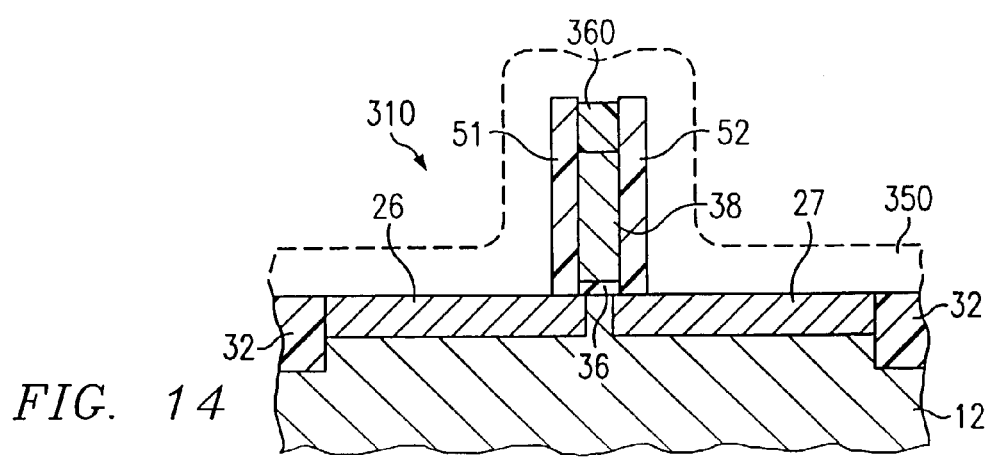
FIG. 14 is a diagrammatic fragmentary sectional side view similar to FIG. 9, but showing an integrated circuit which is alternative embodiment of the integrated circuit of FIG. 9, at an intermediate stage during its fabrication.

FIG. 14 is a diagrammatic fragmentary sectional side view similar to a portion of FIG. 9, but showing an integrated circuit 310 which is an alternative embodiment of the integrated circuit shown in FIG. 9. The integrated circuit 310 has components which are equivalent to components in other embodiments discussed above, and these components are therefore identified in FIG. 14 with the same reference numerals used in prior embodiments. The following discussion focuses primarily on the differences between the embodiment of FIG. 14 and previously-discussed embodiments.

More specifically, the integrated circuit 310 includes a substrate 12 with spaced source and drain regions 26–27. A gate oxide layer 36 and gate electrode 38 are formed on top of the substrate 12, and serve as a gate section. Through use of a not-illustrated temporary cover similar to that shown at 46 in FIG. 2, side walls 51 and 52 are formed on opposite sides of the oxide layer 36 and gate electrode 38, and project upwardly beyond the top of the gate electrode 38. It will be noted that, in FIG. 14, the side walls 51 and 52 do not have supplemental side walls thereon which would be comparable to those shown at 161–164 in FIG. 9. Instead, a layer 350 of a nonconductive material is deposited over the integrated circuit structure. The layer 350 is made of silicon nitride ($Si_3N_4$), but could alternatively be made of some other suitable material. The layer 350 has a thickness which is at least half the distance between the side walls 51 and 52, so that the region between the upper ends of the side walls 51 and 52 is completely filled with the material of the layer 350. Then, an isotropic etch is carried out, in order to remove portions of the layer 350 other than the portion 360 which is disposed between the upper ends of the side walls 51 and 52. This is done without a masking step, by taking advantage of the fact that the portion of layer 350 disposed between the extended side walls is thicker than the remainder of the layer 350. In order to be certain that the portions of the layer 350 above the side walls 51 and 52 has been removed, the layer 350 is subjected to a small amount of over-etching, and thus the top surface of the portion 360 is slightly lower than the upper ends of the side walls 51 and 53. As noted above, FIG. 14 does not depict supplemental side walls of the type discussed above, but in a variation of the embodiment of FIG. 14 it would be possible to provide such supplemental side walls.

Thereafter, a not-illustrated liner and dielectric layer similar to those shown at 66 and 67 in FIG. 9 are deposited over the structure shown in FIG. 14, and further fabrication proceeds in a manner similar to that described for prior embodiments. It will be noted that, since the remaining portion 360 of the layer 350 substantially fills the region between the upper ends of the side walls 51 and 52, the gate electrode 38 is effectively protected from any amount of misalignment of the contact openings, in a manner similar to that described above for the embodiment of FIG. 12.

The present invention provides a number of technical advantages. One such technical advantage is that doping and/or silicide formation for a gate electrode can be carried out at the same time as doping and/or silicide formation for source and drain regions, because a temporary, self-aligned cover is put on the gate electrode to create side wall extensions, and this cover can be removed before doping and/or silicide formation has been completed for each of the source, drain and gate. This reduces the number of mask steps needed to fabricate a transistor having self-aligned contacts. In contrast, pre-existing techniques for forming self-aligned contacts use a cover over the gate which remains in place by the time doping and silicide formation is carried out for the source and drain regions, which involves a larger number of mask steps. Also, in some embodiments, a mask step is not needed in order to distinguish areas where contact is to be made to the gate.

A further consideration is that the approach according to the invention can be achieved without altering the basic design and characteristics of a transistor, thereby permitting it to be used without difficulty in an existing process or circuit that does not presently have self-aligned contacts. Still another technical advantage is derived from the fact that contact openings for source and drain regions are formed separately, through a dielectric layer which is significantly thicker than the gate section disposed between the contact openings. Consequently, to the extent planarization may be needed, for example during formation of conductive contacts within the contact openings, it is carried out at a level spaced well above the gate section, and does not directly cause physical stress to the gate section.

Although selected embodiments have been illustrated and described in detail, it will be understood that various substitutions and alterations can be made therein without departing from the spirit and scope of the present invention, as defined by the following claims.

What is claimed is:

1. An integrated circuit apparatus, comprising:
   structure which includes a first section with an upwardly facing first surface portion thereon, and a second section which is adjacent and projects upwardly beyond said first surface portion, said second section having in the region of an upper end thereof an upwardly facing second surface portion, and said first and second surface portions each being provided on material which is one of conductive and semiconductive;
   a side wall portion which is disposed on a side of said second section nearest said first section, which is made of a non-conductive material, and which comprises a first portion that projects upwardly beyond said second surface portion and a second portion that has substantially the same height as said second section;

a non-conductive layer extending over said first and second sections said non-conductive layer having a top surface spaced substantially above the upper end of said side wall portion, having a further surface on an underside thereof which conforms to said side wall portion and said first and second surface portions, and having therein a recess portion which extends downwardly within said non-conductive layer to a region of said first surface portion; and a portion of conductive material disposed in said recess portion in engagement with said region of said first surface portion, and with an upwardly facing surface portion on an upper end thereof.

2. An apparatus according to claim 1, wherein said non-conductive layer includes a dielectric liner which has said further surface on an underside thereof, and a dielectric layer which is provided on said dielectric liner and which has said top surface thereon.

3. An apparatus according to claim 1, including a supplemental wall portion disposed on a surface of said side wall portion facing away from said first section, said supplemental wall portion being made of a non-conductive material, and being disposed between said second surface portion and an outer end of said side wall portion.

4. An integrated circuit apparatus, comprising:

structure which includes spaced first and second sections respectively having upwardly facing first and second surface portions thereon, and a third section which is disposed between and projects upwardly beyond said first and second surface portions, said third section having in the region of an upper end thereof an upwardly facing third surface portion, and said first, second and third surface portions each being provided on material which is one of conductive and semiconductive;

first and second side wall portions which are disposed on opposite sides of said third section, which are made of a non-conductive material, and which each comprise a first area that projects upwardly beyond said third surface portion and a second area that does not project upwardly beyond the third surface portion, said first area of said first side wall portion being located between said third section and said first section and said first area of said second side wall portion being located between said third section and said second section;

a non-conductive layer having a top surface spaced substantially above the upper ends of each of said first and second side wall portions, having a further surface on an underside thereof which conforms to said side wall portions and said first, second and third surface portions, and having therein spaced first and second recess portions which each extend downwardly within said non-conductive layer, respectively to a region of said first surface portion and a region of said second surface portion; and first and second portions of a conductive material respectively disposed in said first and second recess portions and respectively in electrical engagement with said first and second surface portions, each of said first and second portions of said conductive material having on an upper end thereof an upwardly facing surface portion.

5. An apparatus according to claim 4, wherein said non-conductive layer includes a dielectric liner which has said further surface on an underside thereof, and a dielectric layer which is provided on said dielectric liner and which has said top surface thereon.

6. An apparatus according to claim 4, including first and second supplemental wall portions respectively disposed on surfaces of said first and second side wall portions which face each other, said supplemental wall portions each being made of a non-conductive material and each being disposed between said third surface portion and the outer end of a respective one of said side wall portions.

7. An apparatus according to claim 6, wherein said third section has first and second portions which each have thereon part of said third surface portion and which are spaced in a direction transverse to a direction in which said first and second sections are spaced, said first portion of said third section being disposed between said first and second sections, and said first and second portions of said third section each having thereon said side wall portions which project above said third surface portion; wherein said non-conductive layer has therein a third recess portion which extends downwardly within said non-conductive layer to a region of said third surface portion disposed on said second portion of said third section; and including a third portion of a conductive material disposed in said third recess portion in electrical engagement with said third surface portion and having on an upper end thereof an upwardly facing surface portion.

8. An apparatus according to claim 6, wherein said third section has first and second portions, said first portion of said third section having thereon said third surface portion and having thereon said side wall portions which project above said third surface portion, and said second portion of said third section being free of side wall portions that project beyond an upper end thereof.

9. An apparatus according to claim 6, wherein said third section has first and second portions which are each disposed between said first and second wall portions, said second portion of said third section being wider than said first portion thereof.

* * * * *